United States Patent
Haager et al.

(10) Patent No.: US 7,257,886 B2
(45) Date of Patent: *Aug. 21, 2007

(54) APPARATUS FOR INSERTING, RETAINING AND EXTRACTING A DEVICE FROM A COMPARTMENT

(75) Inventors: James A. Haager, Phoenix, AZ (US); Ronald E. Tupa, Mesa, AZ (US); Daniel P. Fogelson, Chandler, AZ (US)

(73) Assignee: Adtron Corporation, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/330,858

(22) Filed: Jan. 12, 2006

(65) Prior Publication Data
US 2006/0150403 A1     Jul. 13, 2006

Related U.S. Application Data (60) Provisional application No. 60/643,524, filed on Jan. 12, 2005.

(51) Int. Cl.
*B23P 19/00* (2006.01)
(52) U.S. Cl. ............... 29/739; 29/740; 439/64; 439/362; 439/680; 361/685; 361/695
(58) Field of Classification Search ............ 29/739, 29/740; 439/64, 362, 680; 361/685, 695
See application file for complete search history.

(56) References Cited

U.S. PATENT DOCUMENTS

| | | | | |
|---|---|---|---|---|
| 4,941,841 A | * | 7/1990 | Darden et al. | 361/685 |
| 5,492,481 A | * | 2/1996 | Lewis | 439/159 |
| 6,414,928 B1 | | 7/2002 | Aoki et al. | 369/77.1 |
| 6,456,489 B1 | | 9/2002 | Davis et al. | 361/684 |
| 6,473,297 B1 | * | 10/2002 | Behl et al. | 361/685 |
| 6,716,035 B2 | * | 4/2004 | Haager et al. | 439/64 |
| 6,744,635 B2 | | 6/2004 | Portman et al. | 361/760 |
| 6,831,832 B2 | * | 12/2004 | Haager et al. | 361/685 |
| 6,918,177 B2 | | 7/2005 | Haager et al. | 29/832 |

(Continued)

OTHER PUBLICATIONS

AMAMAX, webpages reciting removable racks for hard disk drives, printed Aug. 2, 2005.

(Continued)

*Primary Examiner*—Carl J. Arbes
(74) *Attorney, Agent, or Firm*—Cahill, von Hellens & Glazer P.L.C.

(57) ABSTRACT

Each of one or more devices to be detachably attached to a mechanical substructure includes rails on opposed sides with insertion/extraction mechanisms. Each of a plurality of pairs of guides mounted on the substructure slidably receives and retains a respective set of rails upon attachment of the devices. The insertion/extraction mechanism includes one or more pivotable handles associated with each device for retaining the device with the substructure. A spring extending from a rail makes electrical contact with electrostatic discharge ground pads on the substructure to discharge existing static charge from the device prior to electrical engagement between an electrical connector on the device and an electrical connector on the substructure. An apertured plate of the substructure includes a plurality of apertures through which the devices are inserted/extracted. A face plate may be hingedly attached to and removable from the apertured plate to cover all of the apertures therein that accommodate insertion/extraction of the devices.

8 Claims, 8 Drawing Sheets

U.S. PATENT DOCUMENTS

2003/0228773 A1* 12/2003 Haager et al. ................ 439/64

OTHER PUBLICATIONS

DIRECTRON, webpages entitled "Lian-Li Aluminum Inner Tray for RH-321 Moblie (sic) Rack for 720/15000RPM 3.5"HDD, Copyright dates of 1997-2005.

DIRECTON, webpages entitled "Lian-Li RH-321 Mobile Rack", 2 pages as published on internet, Copyright dates of 1997-2005..

RAM, webpages entitled "Hard Drive Mobile Racks", 2 pages as published on internet, date unknown.

* cited by examiner

APPARATUS FOR INSERTING, RETAINING AND EXTRACTING A DEVICE FROM A COMPARTMENT

CROSS REFERENCE TO RELATED APPLICATIONS

The present application is related to and claims priority to a provisional application entitled "Method and Apparatus for Inserting, Retaining and Extracting a Device from a Compartment", filed Jan. 12, 2005, and assigned Ser. No. 60/643,524, which application describes an invention by the present inventors and is assigned to the present assignee.

BACKGROUND OF THE INVENTION

1. Field of the Invention

The present invention relates to mating assemblies and, more particularly, to a guide assembly for mechanically supporting and electrically connecting a rail mounted device.

2. Description of the Related Prior Art

Various mechanical substructures, such as printed wiring boards and other mechanical devices provide support for detachably attached devices of various sorts that are electrically connected to elements attendant the mechanical substructure. No industry standard presently exists for mounting such devices on the mechanical substructure. Accordingly, provisions must be made unique to each device to mount same. Furthermore, the electrical interconnections vary widely in type and usually require manual engagement. The potential for substantial damage due to static electricity to components mounted on the mechanical substructure or components of a device being mounted exists. To dissipate any electrostatic charges, known procedures must be employed but the carrying out of such procedures is sometimes omitted with attendant actual or potential damage to one or more components.

SUMMARY OF INVENTION

The present invention relates to guides mounted upon a mechanical substructure for engaging corresponding rails attached to a device to be demountably mounted upon the mechanical substructure. The alignment of the device with components of the mechanical substructure is assured through predetermined interconnection and alignment between the guides and the rails. Such alignment permits mating between electro-mechanical connectors attendant the device and the mechanical substructure. Elements interacting between the guides, mechanical substructure, and rails assure dissipation of any electrostatic charges and zero static potential upon mounting of the device to preclude damage to the electrical components from static electricity. The cooperative engagement between the guides and rails eliminates the need for manual access to make further mechanical or electrical connections and thereby permits a low profile mechanical packaging enclosure commensurate in size with the device to be mounted. The device is retained upon the structure by one ore more pivotable lockable handles that may be grasped to insert, lock, unlock and retract the device.

It is therefore a primary objective of the present invention to provide a guide and rail assembly, and an insertion/extraction mechanism for mating and electrically connecting a device to a mechanical substructure.

Another object of the present invention is to provide an industry standard assembly for demountably mounting electromechanical devices on a mechanical substructure.

Still another object of the present invention is to provide a mating assembly which dissipates any existing electrostatic charges during the mounting procedure.

Yet another objective of the present invention is to provide a mounting assembly which eliminates the need for manual mechanical connection and manual engagement of mating electrical conductors.

A further object of the present invention is to provide rails attachable to any device, or a housing therefor, for engagement with guides mounted on a mechanical substructure to which the device is to be mechanically and electrically connected.

A yet further object of the present invention is to provide a method for electrostatic dissipation upon mechanical and electrical attachment of a device to a substructure.

A still further object of the present invention is to provide guides attachable to a front panel of a substructure, providing strength to the aligned guides, the substructure, and the device mounted on the guides.

A still further object of the present invention is to provide either one or two pivotable handles secured to a device or housing for manually inserting and retracting the device from within a compartment having a substructure for engaging the device.

A still further object of the present invention is to provide either one or two pivotable handles secured to a device or housing for manually locking and unlocking the device within a compartment having a substructure for engaging the device.

These and other objects of the invention will become apparent to those skilled in the art as the description of the invention proceeds.

DESCRIPTION OF THE DRAWINGS

The present invention will be described with greater specificity and clarity with reference to the following drawings, in which.

DESCRIPTION OF THE PREFERRED EMBODIMENT

Figure 1:
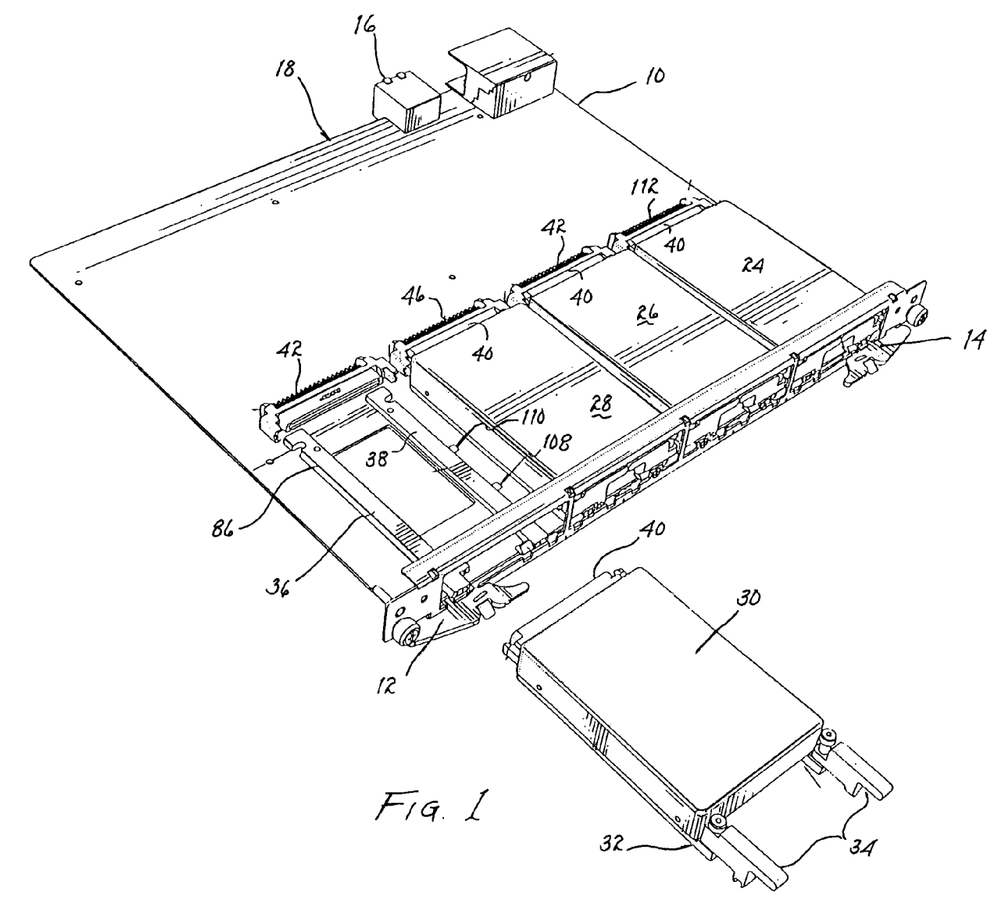
FIG. 1 illustrates a substructure used as a mounting for various electrical, electromechanical and mechanical elements, including illustration of devices mounted thereon and of a device segregated from the substructure and mountable thereon.
Figure 2:
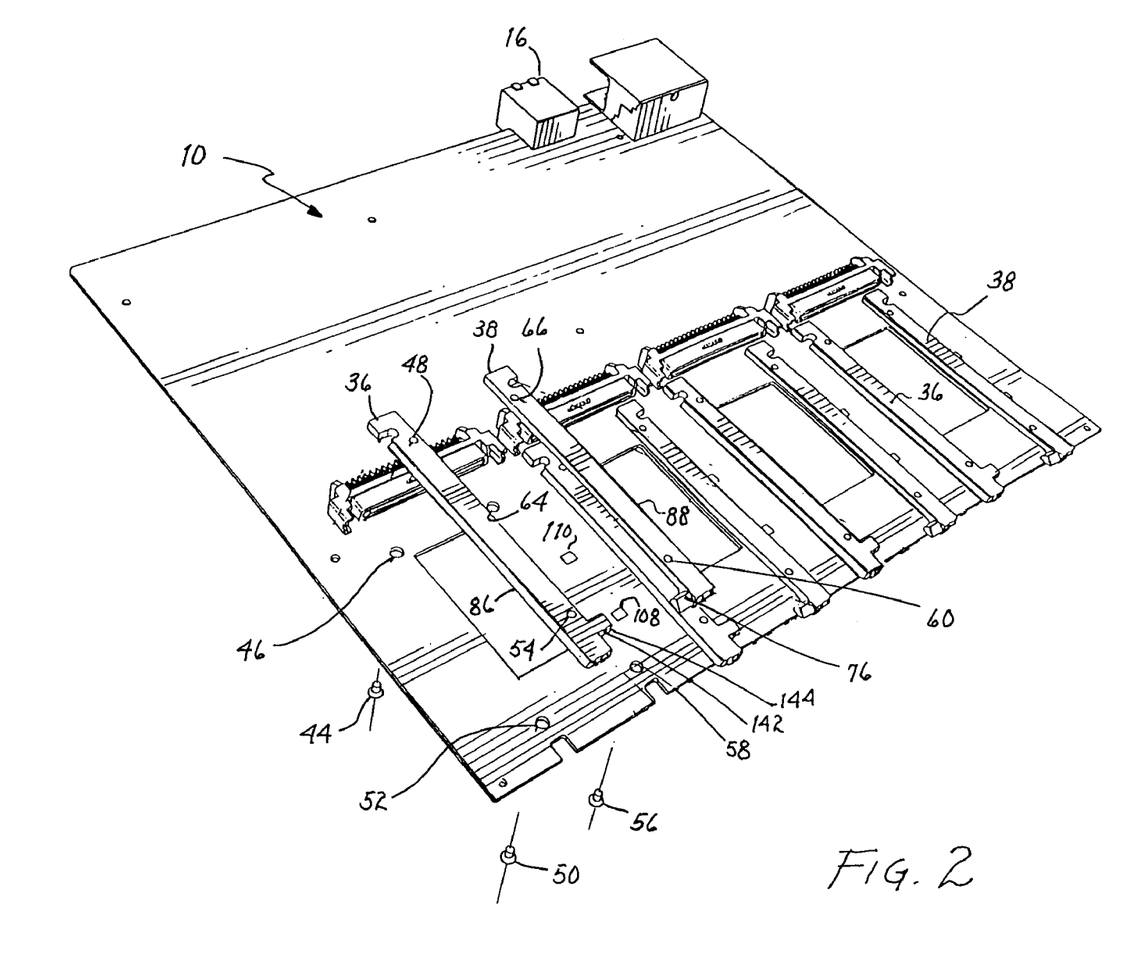
FIG. 2 illustrates mounting elements or guides for engaging and supporting devices to be mounted upon the substructure.

Referring to FIGS. 1 and 2 there is shown a mechanical substructure 10 used as a mounting for various electrical, electromechanical and mechanical elements. The substructure is typically removable from a chassis of a signal processing equipment. Generally, substructure 10 and the elements forming a part thereof will constitute a component of a unit (not shown) wherein signal processing is performed. The substructure may incorporate clasps 12 and 14 for detachably attaching a face plate to the substructure. Substructure 10 may also include various electromechanical connectors 16 disposed along rear edge 18 for electrically engaging other components of the signal processing equipment. Although not shown, various electrical components, such as integrated circuits, transistors, resistors, capacitors, inductors, microprocessors, etc. may be mounted on the substructure.

Electrico-mechanical devices, such as media storage devices, hard disk drives, etc., may be demountably mounted upon substructure 10 in conformance with the teachings of the present invention. Devices 24, 26, and 28 are mechanically mounted upon the substructure and electrically connected thereto, as will be described below. Device 30 is illustrated apart from substructure 10 ready for mounting thereon. A pair of rails 32, 34 are mounted along opposed edges at the bottom of each of devices of 24, 26, 28 and 30 for the purpose of attaching the devices to substructure 10. Several pairs of guides, 36, 38 are mounted on substructure 10 for sliding engagement with the rails of a respective device. As shown, four pairs of guides are mounted upon substructure 10 to slidably cooperate with the rails of the four devices shown in FIG. 1. Each device includes an electrical connector 40 for mechanical and electrical engagement with a further electrical connector 42 mounted upon substructure 10. Upon engagement of a device with the substructure, electrical connectors 40 and 42 will be aligned with one another to obtain an electrical and mechanical interconnection. Thereby, a transfer of electrical signals between each device and various electrical components mounted upon the substructure is achieved.

Figure 3:
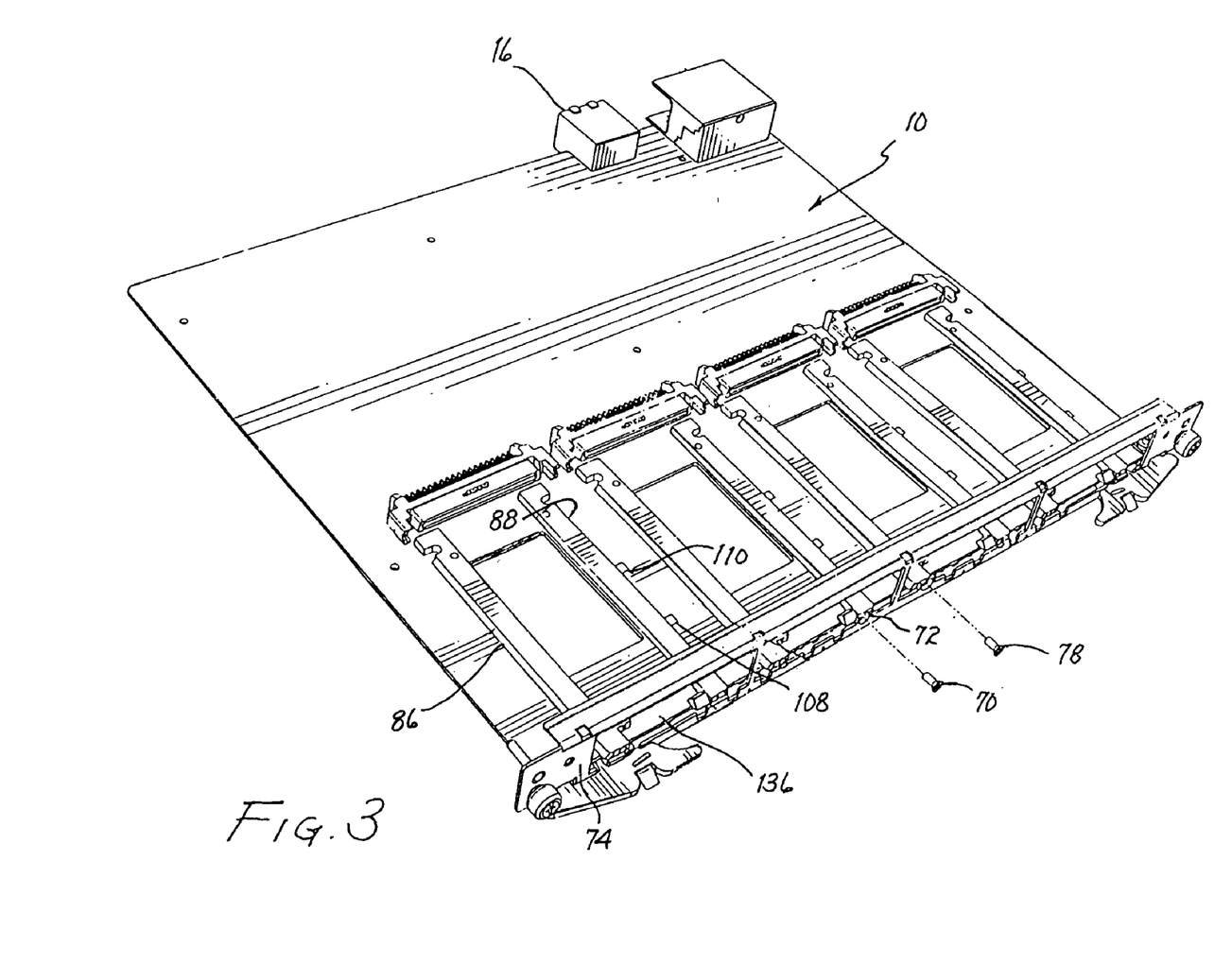
FIG. 3 illustrates the guides attached to the substructure.

As particularly shown in FIGS. 2 and 3, guide 36 is attached to the substructure by a bolt or machine screw 44 penetrably engaging aperture 46 in the substructure and threadedly engaging aperture 48 in guide 36. Similarly, a bolt or machine screw 50 penetrably engages aperture 52 in the substructure and threadedly engages aperture 54 in guide 36. A further bolt or machine screw 56 penetrably engages aperture 58 in the substructure and threadedly engages aperture 60 in guide 38. A further bolt (not shown) penetrably engages aperture 64 in the substructure and threadedly engages aperture 66 in guide 38. Thereby, guides 36 and 38 are rigidly attached to the substructure and spaced apart from one another to slidably engage the pair of rails attached to a device to be demountably mounted thereon. It is to be understood that the remaining pairs of guides are similarly attached to the substructure. Additionally and as particularly shown in FIG. 3, a bolt or machine screw 70 may be penetrably engaged with an aperture 72 in an apertured plate 74 extending upwardly and formed as part of or otherwise attached to substructure 10. Bolt 70 threadedly engages aperture 76 in the end of guide 38. Similarly, a bolt or machine screw 78 extends through an aperture 80 in apertured plate 74 for threaded engagement with aperture 82 in the end of guide 36. The front end of each of the guides illustrated may be similarly attached to the apertured plate to further rigidly mount the guides. Each of guides 36, 38 includes a V-shaped groove 86 and 88 (see also FIG. 7), respectively, for engagement with a corresponding V-shaped ridge extending along each of the respective rails supporting a device. Thereby, vertical and lateral displacement of the rails relative to the guides is precluded while sliding movement therebetween is accommodated.

Figures 4, 5:
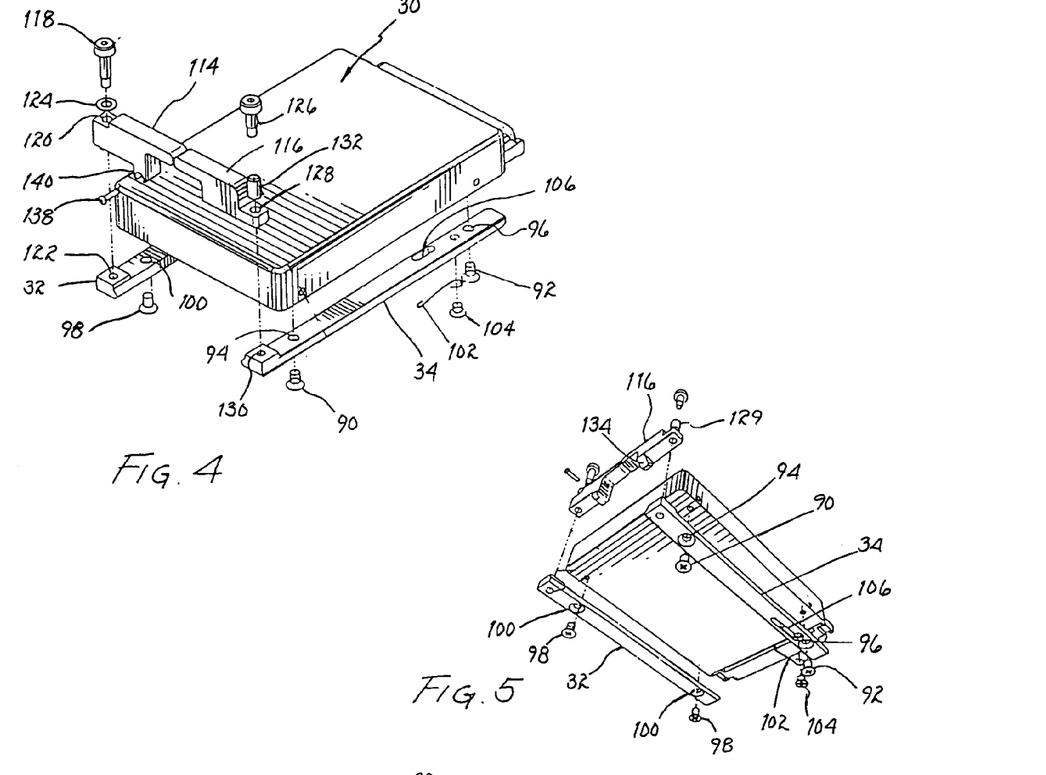
FIGS. 4 and 5 illustrate handles pivotally attached to a device and rails attachable to the device for engagement with the guides of the substructure.

As particularly shown in FIGS. 4 and 5, rail 32 is attached to device 30 by a pair of bolts or machine screws 90, 92 penetrably engaging apertures 94, 96 in rail 34 and into threaded engagement with device 30. It is to be understood that device 30 may be a component or it may be a housing enclosing a plurality of components. Similarly, rail 32 is secured to device 30 by a pair of bolts or machine screws, of which bolt 98 is shown penetrably engaging corresponding apertures, of which aperture 100 is shown and into threaded engagement with device 30. To insure dissipation of any electrostatic charge attendant device 30, a spring 102 is retained within slot 106 by a bolt 104 threadedly engaging rail 34. This spring extends downwardly past the lower edge of the slot and makes contact with the ground pads 108, 110 mounted on the substructure (see FIGS. 1 and 2). Thereby, upon insertion of device 30, any electrostatic charges present are discharged during the act of mounting by spring 102 engaging pads 108, 110.

A pair of handles 114, 116 serve in the manner of an insertion/extraction mechanism to assist in insertion and extraction of device 30. Handle 114 is pivotally attached to the front end of rail 32 by a bolt 118 penetrably engaging passageway 120 in the handle and into threaded engagement with aperture 122 in the rail. A disc spring 124 is located between the head of bolt 118 and passageway 120 to provide a spring bias against pivotal movement of handle 114. Handle 116 is secured to rail 34 by a bolt or machine screw 126 penetrably engaging passageway 128 in the handle and into threaded engagement with aperture 130 in the rail. A compressible sleeve 132 is mounted upon bolt 126 and compressed to provide a downward bias upon handle 116 and restrict inadvertent rotation of the handle. As particularly shown in FIG. 5, handle 116 includes a nubbin 134 extending downwardly therefrom. As shown in FIG. 3, a corresponding nubbin 136 extends upwardly for engagement in the manner of a detent with nubbin 132 extending from handle 116. To rotate handle 116 into the retracted position, as shown in FIG. 4, handle 116 must rise to permit nubbin 134 to clear nubbin 136. Such rise is accommodated by the compressibility of sleeve 132. Handle 114 may be secured in the locked position shown in FIG. 4 by a screw 138 penetrating a passageway 140 in the handle and into threaded engagement with aperture 142 of handle stop 144 (see FIG. 2).

Figure 6:
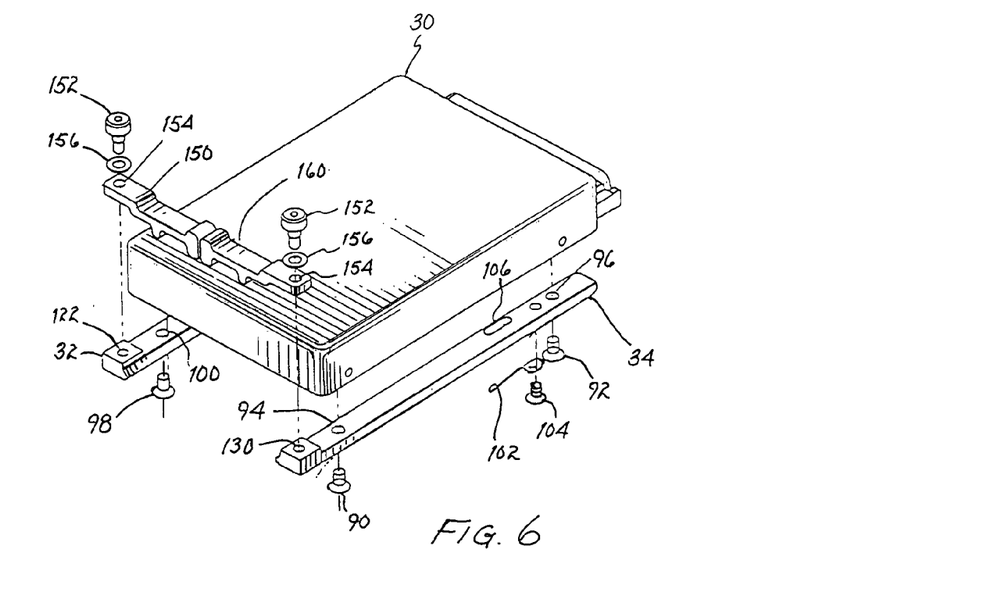
FIG. 6 illustrates a variant of the pivotable handles used for insertion and extraction of a device showing an exploded view of the handles and related rails and the closed position of the handles.

Referring to FIG. 6, there is shown a variant of handles 114 and 116. Handle 150 is rotatably secured to rail 32 by a bolt or machine screw 152 penetrably engaging aperture 154 of the handle and into threaded engagement with aperture 122 in rail 32. A disc spring 156 is supported by bolt 152 and bears on handle 152 compressively as a function of the degree of tightening of bolt 152. Thereby, disc spring 156 provides resistance to pivotal movement of handle 150. Similarly, pivotally supported handle 160 includes a bolt or machine screw 152 penetrably engaging a disc spring 156, aperture 154 and threadedly engaging aperture 130 in rail 34.

Figure 7:
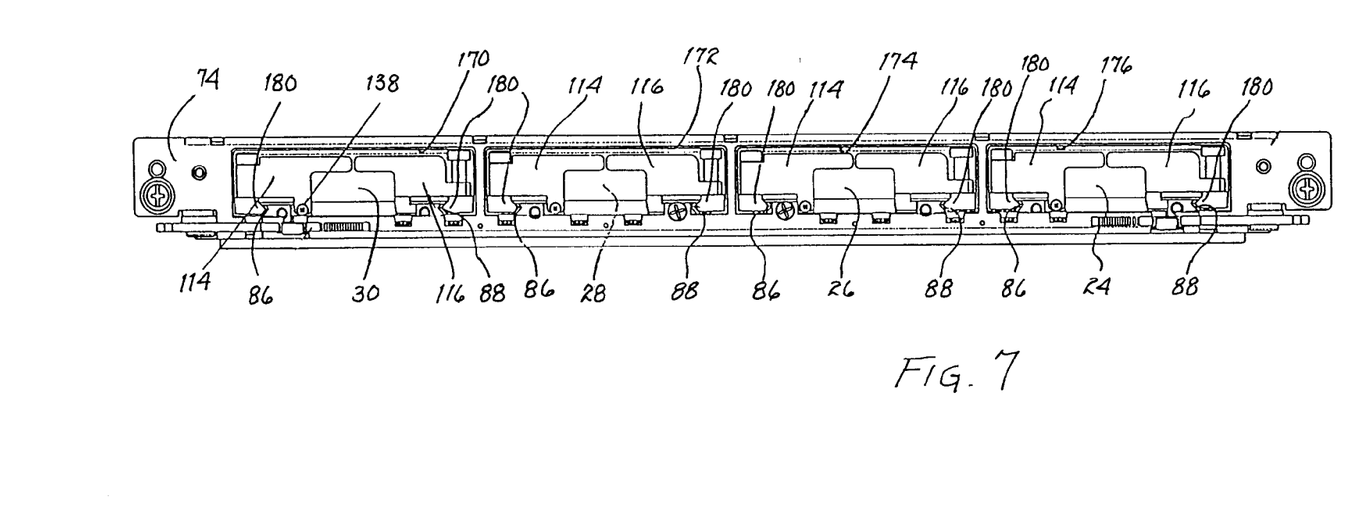
FIG. 7 is a front view of the substructure having mounted thereon a plurality of devices inserted through apertures in a front plate.

FIG. 7 illustrates apertured plate 74 which includes a plurality of slots 170, 172, 174 and 176 through which devices 30, 28, 26 and 24 are inserted, respectively. Handles 114, 116 are shown in a closed position to retain the respective devices therebehind. Additionally, grooves 86 in guides 36, 38 slidingly mate with ridges 180 formed in each of rails 32, 34.

Figure 8:
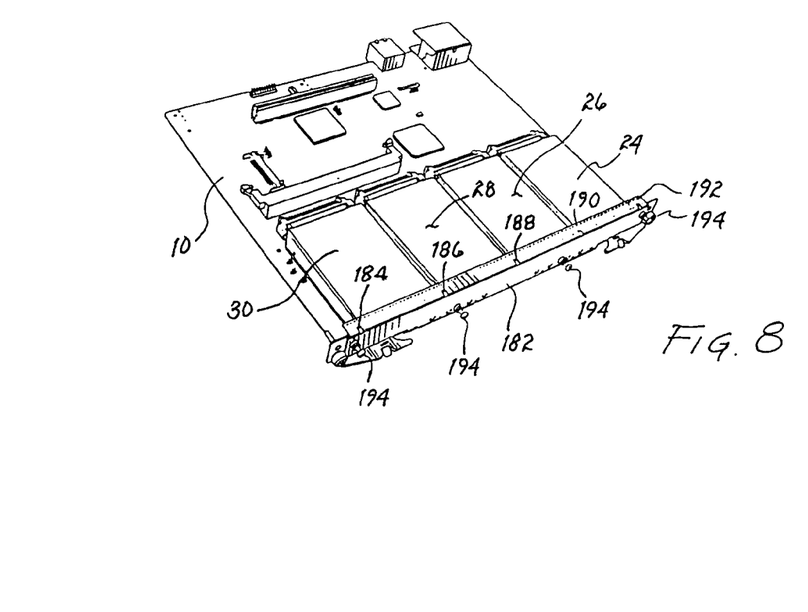
FIG. 8 is a front perspective view of various components mounted on the substructure and including a full length pivotally attached face plate.

FIG. 8 illustrates a perspective view of substructure 10 having various components mounted thereon, including devices 24, 26, 28 and 30; it is to be understood that these may instead be housings containing various components. A face place 182 is hingedly attached to apertured plate 74 by hinges 184, 186, 188, 190 and 192. The face plate is secured by spring loaded quarter turn fasteners 194, which may be of the Zeus type. Thereby, these fasteners remain attached to the face plate when it is pivoted upwardly to accommodate insertion/retraction of devices mounted upon substructure 10.

Figure 9:
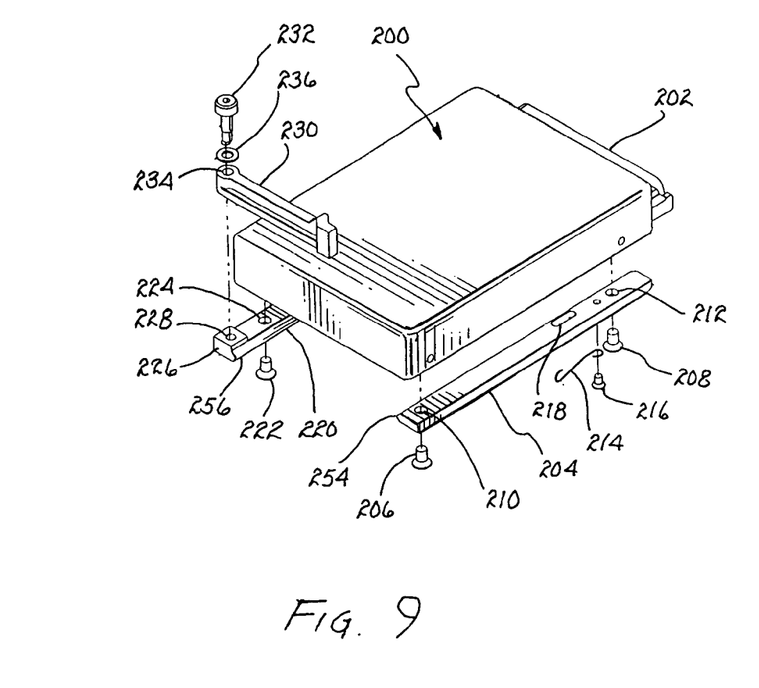
FIGS. 9 and 10 illustrate perspective views of a hard drive having a single pivotable handle and uniquely configured rails attached thereto.

Referring to FIG. 9, there is shown a device that may be of the type previously described. Alternatively, it may be a hard drive 200 having an electrical connector 202 mounted at the rear end. A rail 204 is mounted to the underside of the hard drive along an edge and secured by bolts or machine screws 206, 208 penetrating apertures 210, 212 in the rail and threadedly engaging corresponding apertures in the underside of the hard drive. It may be noted that rail 204 does not extend forwardly of the hard drive. A spring 214, such as described above, is secured to rail 204 by a bolt or machine screw 216 and is free to extend into slot 218 of the rail. Upon contact of this spring with grounding pads on substructure 10, as described above, any electrostatic charges present will be dissipated. Rail 220 is similar to rail 32 described above and is attached to the underside of hard drive 200 by bolts or machine screws 222 penetrably engaging apertures, such as aperture 224, in the rail. Rail 220, like the previously described rails, includes an end 226 supporting a threaded aperture 228. A single handle 230 is pivotally attached to end 226 by a bolt or machine screw 232 extending through a passageway 234 in the handle and into threaded engagement with aperture 228. A disc spring 236 is disposed intermediate the head of bolt 232 and handle 230 to provide resistance against pivotal movement of the handle about the axis of bolt 232 and yet permit such pivotal movement. Thereby, handle 230 will tend to remain in either the closed position, as illustrated, or in an extended position to permit manipulation of the hard drive into and out of engagement with the substructure, as discussed with respect to handles 114, 116 or handles 150, 160.

Figure 10:
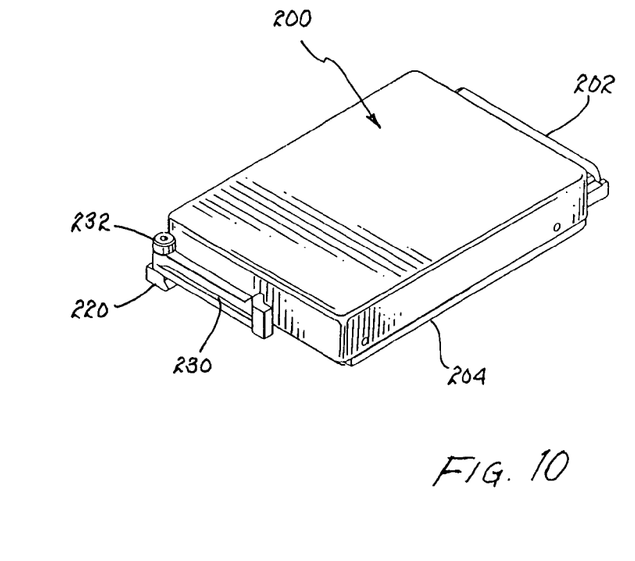

FIG. 10 illustrates hard drive 200 with rails 204 and 220 attached thereto. In this position, handle 230 has been pivoted to a location adjacent the front end of the hard drive, which location corresponds with the hard drive being mounted on substructure 10. As noted previously, and as illustrated in FIG. 9, rails 204 and 220 include inwardly facing ridges 254, 256 for engagement with the grooves of corresponding guide rails mounted upon the substructure.

Figure 11:
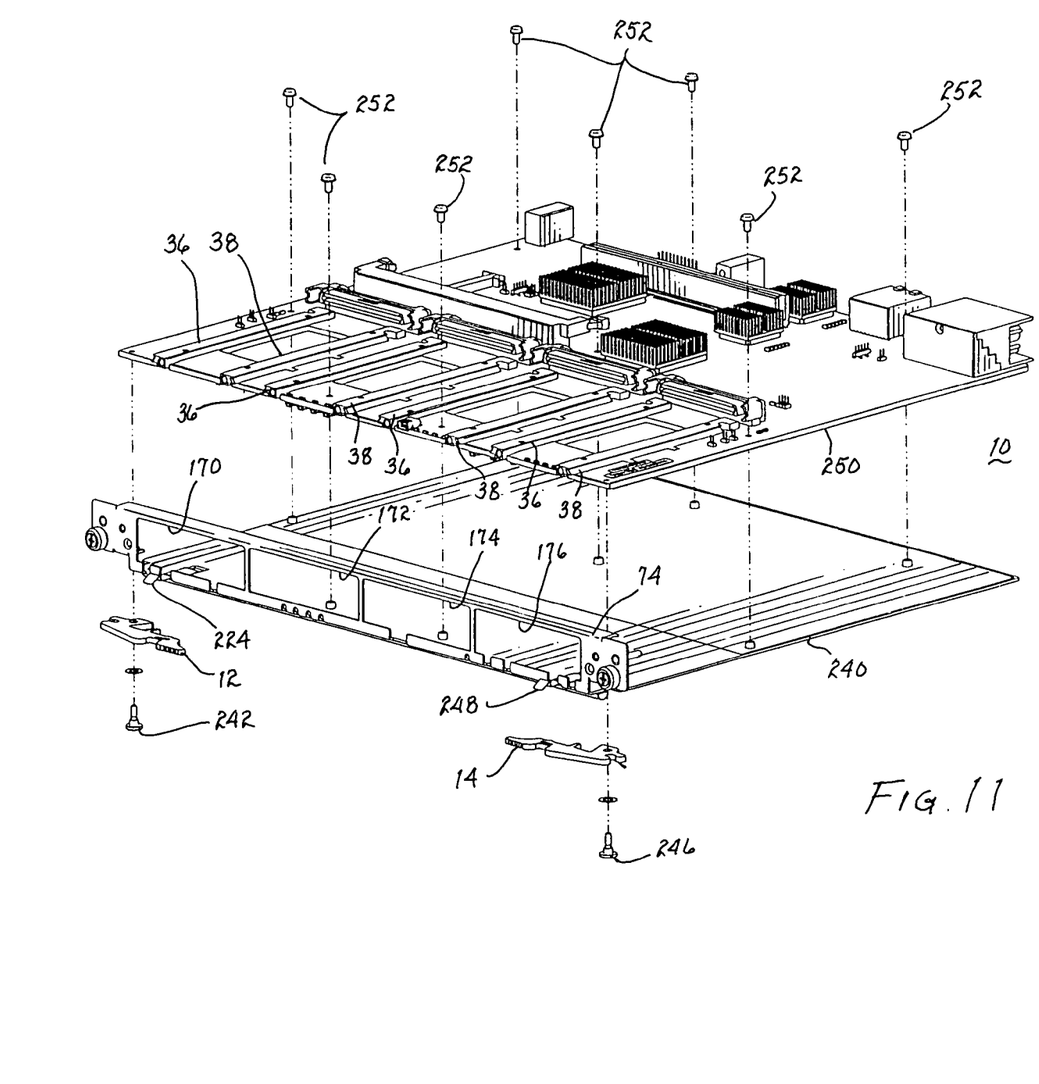
FIG. 11 is an exploded view of the substructure illustrating a circuit board and a supporting plate.
Figure 12:
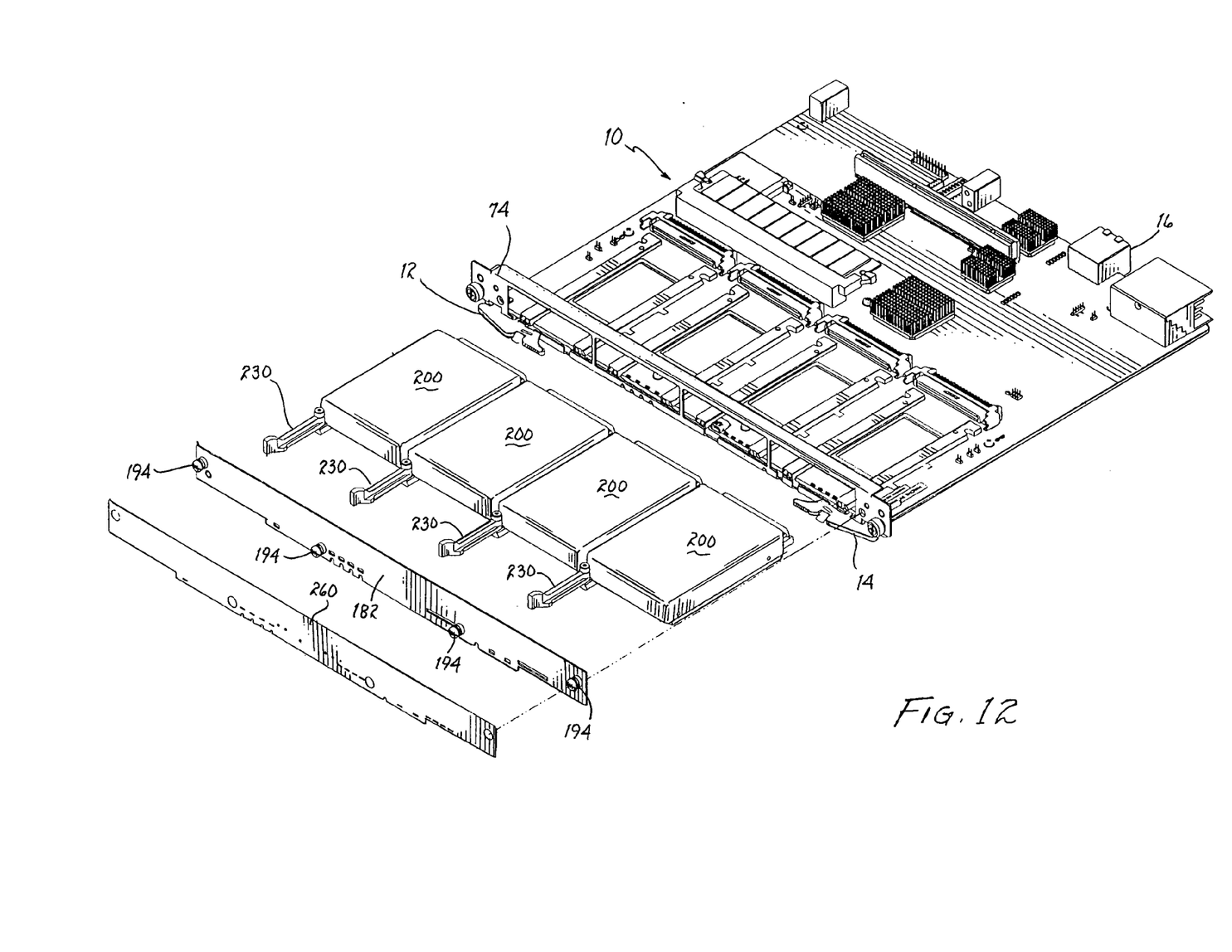
FIG. 12 is an exploded view of components of the substructure.

Referring to FIG. 11, there is shown an exploded view of substructure 10. It includes a base 240, usually of metal, supporting, or formed with apertured plate 74. This plate includes a plurality of apertures 170, 172, 174 and 176 to accommodate ingress and egress of devices to be supported upon the substructure. Clasp 12 is pivotally supported upon a bolt or machine screw 242 to accommodate locking engagement of the clasp with a spring tab 244. Similarly, clasp 14 is pivotally supported upon a bolt or machine screw 246 to accommodate locking engagement with a spring tab 248. A circuit board 250, or the like, is mounted upon base 240 by a plurality of bolts or machine screws 242 as depicted. As described above, a plurality of guides 36, 38 are mounted upon the circuit board to receive and retain the devices or hard drives to be demountably mounted thereon.

A plurality of ancillary electric/electronic equipment may also be mounted upon the circuit board, as indicated, to perform the signal processing function attendant the substructure.

Upon displacement of faceplate 182 from a location adjacent aperture panel 74, whether by pivoting it about attached hinges or by removal, insertion and withdrawal of hard drives 200, or other devices (24, 26, 28 and 30) may be accomplished. Thereby, replacement of defective hard drives or other devices is readily accomplished by pivoting the handle or handles attached to the hard drive or device to be removed and grasping the handle(s) 230 when in its extended position to insert and withdraw the hard drive or device. Upon insertion, the handle(s) are pivoted adjacent the front edge of the hard drive or device and thereafter covered by faceplate 182.

We claim:

1. A mating assembly for detachably attaching a device to a mechanical substructure, said assembly comprising in combination:
    a) a pair of rails disposed on and coupled with opposed sides of the device;
    b) a pair of spaced apart guides mounted upon the substructure for slidably engaging and mating with said pair of rails upon attachment of the device to the substructure; and
    c) securing means for detachably attaching said device to the substructure.

2. The mating assembly as set forth in claim 1 including at least one electrostatic discharge contact electrically coupled with the substructure and an electrostatic discharge spring extending from one of said pair of rails for electrically contacting said electrostatic discharge contact to discharge any static charge present in the device.

3. A mating assembly as set forth in claim 1 wherein said securing means comprises at least one pivotally mounted handle for pulling said device out of engagement with the substructure.

4. The mating assembly as set forth in claim 3 including a pair of said handles.

5. A mating assembly for detachably attaching a device to a mechanical substructure, said assembly comprising in combination:
    a) a pair of rails disposed on and coupled with opposed sides of the device;
    b) a pair of spaced apart guides mounted upon the substructure for slidably engaging and mating with said pair of rails upon attachment of the device to the substructure;
    c) at least one electrostatic discharge contact electrically coupled with the substructure; and
    d) a mechanism for inserting and extracting said device from the substructure.

6. A mating assembly for detachably attaching a device to a mechanical substructure having a front plate defining an aperture for inserting and retracting said device, said assembly comprising:
    a) a pair of rails disposed on and coupled with opposed sides of the device;
    b) a pair of spaced apart guides mounted upon the substructure for slidably engaging and mating with said pair of rails upon attachment of the device to the substructure; and
    c) an insertion/extraction mechanism supported from at least one rail of said pair of rails for inserting and retracting said device through the aperture the aperture in the front plate.

7. The mating assembly as set forth in claim 6 including a spring extending from one rail of said pair of rails for electrically discharging any static charge present to the substructure and at least one contact plate electrically connected to the substructure for sliding engagement with said spring.

8. A mating assembly for detachably attaching a device to a mechanical substructure, said assembly comprising:
   a) a pair of rails disposed on and coupled with opposed sides of the device;
   b) a pair of spaced apart guides mounted upon the substructure for slidably engaging and mating with said pair of rails upon attachment of the device to the substructure;
   c) a first electrical connector attached to the device for engaging a second electrical connector mounted on the substructure upon attachment of the device to the substructure; and
   d) an insertion/extraction mechanism for inserting and extracting said device from the substructure.

* * * * *